United States Patent [19]

Bergenstoff et al.

[11] Patent Number: 4,941,179
[45] Date of Patent: Jul. 10, 1990

[54] METHOD FOR THE REGULATION OF A HEARING AID, A HEARING AID AND THE USE THEREOF

[75] Inventors: Hans Bergenstoff; Torsten Otto, both of Hilleroed, Denmark

[73] Assignee: GN Davavox A/S, Copenhagen SV, Denmark

[21] Appl. No.: 186,930

[22] Filed: Apr. 27, 1988

Related U.S. Application Data

[63] Continuation-in-part of Ser. No. 804,054, Dec. 3, 1985, abandoned.

[51] Int. Cl.$^5$ .................. H04R 25/00; H03G 5/02; H03G 5/14
[52] U.S. Cl. ................................................. 381/68.4
[58] Field of Search .................. 381/68, 68.2, 68.4

[56] References Cited

U.S. PATENT DOCUMENTS

| | | | |
|---|---|---|---|
| 3,784,750 | 1/1974 | Stearns et al. | 381/68 |
| 3,818,149 | 6/1974 | Stearns et al. | 381/68 |
| 3,928,733 | 12/1975 | Hueber | 381/68.4 |
| 3,989,904 | 11/1976 | Rohrer et al. | 381/68.2 |
| 4,099,035 | 7/1978 | Yanick | 381/68.2 |
| 4,118,604 | 10/1978 | Yanick | 381/68.2 |
| 4,119,814 | 10/1978 | Harless | 381/68.2 |
| 4,276,781 | 7/1981 | Leitner | 73/647 |
| 4,335,281 | 6/1982 | Scott et al. | 379/430 |
| 4,393,275 | 7/1983 | Feldman et al. | 381/68 |
| 4,425,481 | 1/1984 | Mansgold et al. | 381/68 |
| 4,454,609 | 6/1984 | Kates | 381/68 |
| 4,471,171 | 9/1984 | Kopke et al. | 381/68 |
| 4,484,345 | 11/1984 | Stearns | 381/68.2 |
| 4,575,586 | 3/1986 | Topholm | 381/68.2 |
| 4,577,641 | 3/1986 | Hochmair et al. | 381/68.2 |
| 4,634,815 | 1/1987 | Marquis | 381/68.4 |
| 4,638,125 | 1/1987 | Buettner | 381/68.4 |
| 4,731,850 | 3/1988 | Levitt et al. | 381/68.2 |
| 4,792,977 | 12/1988 | Anderson et al. | 381/68.2 |

FOREIGN PATENT DOCUMENTS

| | | |
|---|---|---|
| 2931482 | 2/1981 | Fed. Rep. of Germany . |
| 3141420 | 5/1983 | Fed. Rep. of Germany . |
| 3205685 | 8/1983 | Fed. Rep. of Germany . |
| 1316557 | 7/1968 | France . |

OTHER PUBLICATIONS

Mead C. Killion, Recent Earmolds for Wideband OTE and ITE Hearing Aids, Hearing Journal at 15, (Aug. 1984).

Wayne J. Staab, Development of a Programmable Behind-the-Ear Hearing Instrument, 39 Hearing Instruments No. 8, Oct. 1988, p. 22.

Primary Examiner—Jin F. Ng
Assistant Examiner—Danita Byrd
Attorney, Agent, or Firm—Merchant, Gould, Smith, Edell, Welter & Schmidt

[57] ABSTRACT

A hearing aid for relieving high frequency hearing loss, includes a volume control that allows the user to gradually adjust and increase the degree of compensation at a pace which corresponds to their particular need. The volume control changes the slope of the response from a flat insertion gain response, when it is turned down, to a rising insertion gain, when it is turned up. Thus, the volume control is not a traditional gain control but a slope control by which the sound clarity can be adjusted.

2 Claims, 4 Drawing Sheets

METHOD FOR THE REGULATION OF A HEARING AID, A HEARING AID AND THE USE THEREOF

This is a continuation-in-part of U.S. application Ser. No. 804,054 filed 3 Dec. 1985 now abandoned.

Technical Field

The invention relates to a method of regulating a hearing aid.

BACKGROUND OF THE INVENTION.

The majority of the hearing impaired individuals who visit hearing clinics and hearing instrument dispensers are persons suffering from high frequency hearing loss caused by presbycusis, noise-induced hearing loss or combinations of the two. The consequence of such hearing loss is reduced understanding of speech, particularly in noisy environments. This is because the hearing impairment is located in the frequencies most important for the understanding of speech, as well as in the speech frequencies with the lowest sound intensity.

High frequency hearing impairments develop gradually and often go unnoticed for many years. In addition, the patients have almost normal hearing at low frequencies, which gives them the impression of loudness without contributing to understanding. Consequently, these individuals often are not very motivated to use hearing instruments. Frequently, they claim that they hear well enough if others would only speak more distinctly. If their impairment is not remedied, these people risk having to live an isolated life with very limited social contact.

Persons suffering from presbycusis or noise-induced hearing loss are reluctant to accept hearing instruments or flatly refuse to wear them at all. They claim that the sound is too sharp and too noisy. This is because their hearing impairment has developed over a long period of time, causing them to gradually become accustomed to a sense of hearing in which high frequencies are missing. When fitting a hearing instrument with the correct characteristics for this kind of hearing loss, the sudden renewed confrontation with high frequencies can be a very unpleasant experience, even if improved speech discrimination in quiet environments is observed. Usually, the hearing specialist has to make a very difficult compromise between acceptance and optimum speech discrimination. In fact, such cases call for a gradual compensation of the high frequency part of the hearing loss. Using ordinary hearing instruments, this can be a protracted and very complicated process, since the wearer's individual psyche and patience, as well as the actual acoustic environment, have to be taken into account.

On the basis of measurements made on a large number of hearing impaired with high-frequency hearing loss, one can plot curves of the hearing loss as a function of the frequency, with the peoples' ages as a parameter, which is shown stylized in FIG. 1 of the drawing. These and other corresponding curves can be seen in many textbooks and periodicals concerning the subject. At frequencies below approximately 1000 Hz, the hearing loss is not dependent on frequency, while at the higher frequencies it is frequency-dependent, as can be seen quite clearly in FIG. 1. From this it can be seen that a large number of people in the age group of 30-60 years have a frequency-dependent hearing loss above approximately 1000 Hz, which can give hearing problems, while those below 1000 Hz have almost normal hearing. Above approximately 1000 Hz, the higher the age of the person, the greater the slope.

SUMMARY

The present invention relates to a new method and a hearing aid for the relieving of high-frequency hearing losses. For many years, high-frequency hearing loss has been able to be helped by providing the patient with one or two hearing aids which are arranged in such a manner that an audiologist adjusts the aid's frequency response in accordance with the patient's data, including audiograms, while the patient himself or herself adjusts the amplification over the whole frequency range by means of an adjustable volume control. Many patients find it difficult to get used to this form of adjustment, because they can now suddenly hear all the high-frequency sounds which for many years they have not been able to perceive at all, the result being that they often complain that the hearing aid is "noisy" and that the sound becomes very "sharp". Therefore, in many cases, the audiologist must carry out the adjustments in several steps and over several months, so that the patient slowly becomes accustomed to being able to hear normally again. Many people do not have the patience to undergo this period of adjustment, and thus in many cases the fitting of the hearing aids has not been successful.

In order to overcome the problems involved in the fitting, acceptance and use of hearing instruments for high frequency hearing loss, a totally new concept of hearing instrument has evolved. The development of the Danavox Audio Focus ® has been accomplished by changing the effect of the traditional volume control so that instead of affecting the gain equally at all frequencies, it changes the slope of the response from a flat insertion gain response, when it is turned down, to a rising insertion gain, when it is turned up. The patients themselves then can gradually adjust and increase the degree of compensation at a pace which corresponds to their immediate individual need, their rate of adjustment and the actual acoustic environment. Thus, the volume control is not a traditional gain control but a slope control by which the sound clarity can be adjusted.

This effect of the control has been achieved by adding an extra amplifier in the circuit. This amplifier operates as an adjustable, third order active filter in a frequency dependent, low noise, feedback loop circuit. The basic, frequency independent gain adjustment is made by the hearing specialist by using a pre-set control on the instrument. For patients with tolerance problems, the instrument also is provided with a pre-set volume limiter ensuring that the output sound pressure level never exceeds the patient's level of discomfort.

The fitting of this instrument to patients has proven to be logical and uncomplicated, since the hearing specialist merely sets the basic gain to the point where the patient just experiences the sound coming through the instrument or to the point where the desired real ear insertion gain at low frequencies is achieved. Thereafter, the patient himself, by using the Clarity Control, can adjust the slope of the response according to individual need and acceptance.

In cases of more serious hearing loss, audiological support is as a rule necessary in order to ascertain which type of hearing impairment one has. A frequent complaint is called age-determined hearing loss or presbyacusis. Presbyacusis is normally ascertained by plotting an audiogram with two curves over the ear's hearing loss, namely the hearing loss by air conduction and by bone conduction. If these two curves for the same ear are substantially coincident and are of the character as shown in FIG. 1, and at the same time the patient is more than 50 years of age, what is normally involved is presbyacusis. Approximately 50% of all hearing-impaired people suffer from presbyacusis.

Also here it has proved that many people with such greater hearing losses can be helped with the present invention. If one proceeds according to the present invention, it is possible to compensate both for the frequency-independent hearing loss at the low frequencies and the frequency-dependent hearing loss at the high frequencies, without the normal problems of accustomization in connection with ordinary hearing aids.

When the audiologist, on the basis of the patient's data, including audiograms, has been able to ascertain that the patient is suffering from a high-frequency hearing loss, e.g. presbyacusis, one or two hearing aids according to the invention are supplied to the patient, who is thereafter able to regulate the frequency-dependent insertion gain as required, whereby the known problems of accustomization are minimized, in that day by day or week by week, the patient can gradually insert greater and greater amplification for the high frequencies.

If one proceeds according to the preferred invention, one completely avoids the problems with the patients themselves possibly undertaking the regulation of the basic amplification. One avoids incorrect setting of the hearing aid, in that the audiologist, on the basis of the audiograms, sets the basic amplification up to a suitable level, after which the patients themselves can set and change the frequency-dependent part of the insertion gain. It is thus easier for the patient to get accustomed to the hearing aid. In this connection it has proved to be of great advantage that it is the patients themselves who determine how long the period of accustomization shall be.

The hearing aid according to the invention is thus actually devoid of volume control in the traditional sense and seen from the user's side, but many experiments have proved that this is completely without significance for users with high-frequency hearing losses, e.g. presbyacusis patients, when they can regulate the slope of the frequency curve for the insertion gain. This actually works as a kind of volume control, but precisely in the frequency-dependent mode which people with this type of hearing loss have use for.

The hearing aid according to the invention can, for example, be constructed to provide an amplification system containing a low-pass filter of the 3rd order in a feedback circuit with which one can regulate the insertion gain frequency-dependent above a preselected transition frequency, so that an adjustable treble boost is obtained, in that the slope of the frequency response is variably adjustable above the transition frequency of the filter.

An aid according to the present invention provides a simple circuit which is easy to realize, for example as one or more integrated circuits, whereby the purely physical extent can be minimized, which is of great significance in a hearing aid where the space is highly restricted.

The primary use of the hearing aid according to the invention is to relieve high=frequency hearing loss, as. However, the hearing aid could also be used for patients with other forms of greater hearing losses or hearing impairments.

A hearing aid according to the invention can preferably be constructed as an all-in-the-ear aid, but naturally it can also be constructed as a behind-the-ear aid or as hearing spectacles or as an aid which is carried on the body.

BRIEF DESCRIPTION OF THE DRAWINGS.

The invention will now be described in closer detail with reference to the drawing, where.

DETAILED DESCRIPTION

Figure 1:
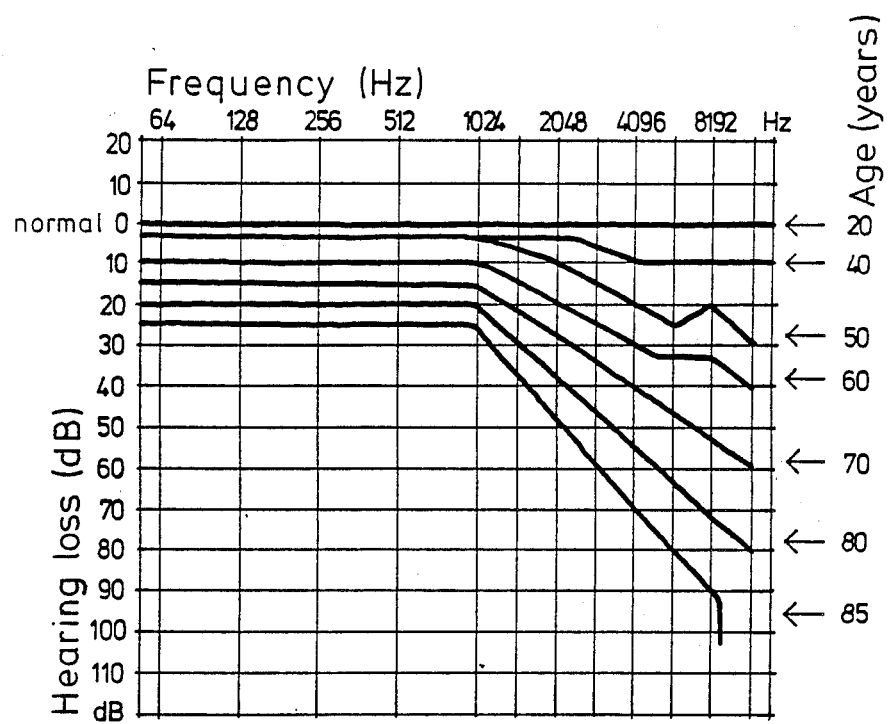
FIG. 1 shows a stylized group of curves covering age-determined hearing losses as a function of the frequency.

FIG. 1 of the drawing shows the above-mentioned stylized curves covering age-determined hearing losses as a function of the frequency. The curves have been drawn up from a very large number of audiograms from people suffer from presbyacusis and other forms of high-frequency hearing loss. It can be seen quite clearly that at frequencies higher than approximately 1000 Hz, there is a frequency-dependent hearing loss which gets even more serious with age. Below approximately 1000 Hz, the hearing loss is less and, what is very characteristic, independent of frequency.

It is clearly seen that right up until an age of about 60 years, the hearing loss in the low-frequency range below approximately 1000 Hz does not normally exceed 10 dB, and for people under the age of 50, the hearing lost in the low-frequency range does not normally exceed 3-4 dB. Thus the people in these groups do not need to have the sound picture in this frequency range amplified very much, but above approximately 1000 Hz the hearing loss is more pronounced.

On the other hand, people of higher age have greater hearing losses. For example, a presbyacusis patient of 80 years of age thus has a typical hearing loss of approximately 20 dB at frequencies below 1000 Hz, and a frequency-dependent hearing loss which, from approximately 1000 Hz to approximately 8000 Hz, increases by approximately 50 dB, so that at approximately 8000 Hz the patient has a hearing loss of approximately 70 dB, see FIG. 1.

Figure 2:
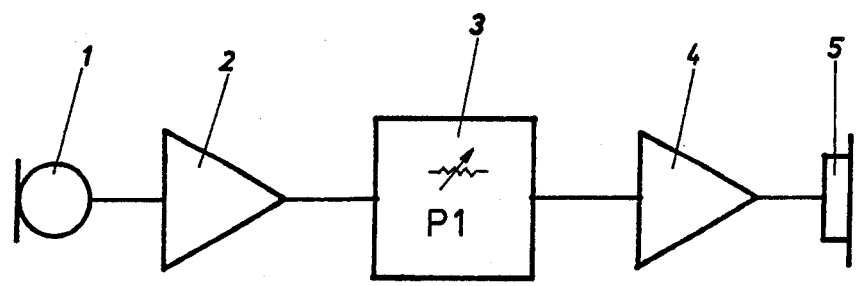
FIG. 2 shows the principle construction of a hearing aid according to the invention.

According to the invention, in principle the hearing aid is arranged as thus shown in FIG. 2, where in a normal manner the aid comprises a sound detector, for example a microphone 1, coupled to a pre-amplifier. It is obvious that the pre-amplifier 2 can have other signal sources, for example a pick-up coil etc. The hearing aid also has an ordinary output amplifier 4 and a sound reproduction device in the form of a telephone capsule or a bone-conduction telephone 5.

The regulation part 3 has a user-operated regulating element P1 with which the slope of the amplifier's working frequency above a transition frequency of approximately 1000 Hz can be varied, so that a variable treble boost is obtained which compensates for the hearing loss. The user merely procures one or two hearing aids which can be self-adjusted until a suitable compensation is achieved.

Figure 3:
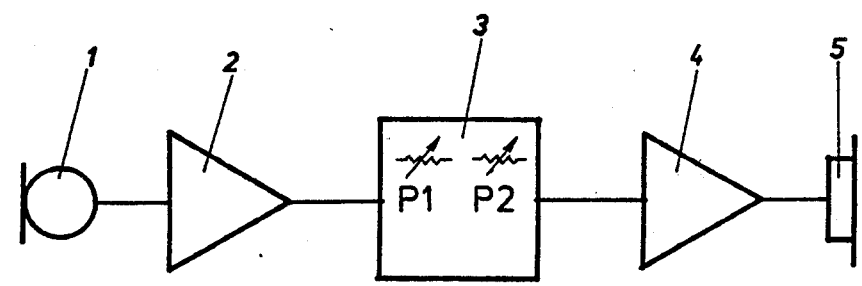
FIG. 3 shows the principle construction of another embodiment of the hearing aid according to the invention.

In cases of greater hearing losses, where the user must also compensate for a hearing loss at frequencies below 1000 Hz, a hearing aid is used which in principle is arranged as shown in FIG. 3, where the regulating part is extended. Between the pre-amplifier 2 and the output amplifier 4 there is placed a regulation part 3 with at least two regulating elements P1 and P2. The regulation part 3 is described in more detail in connection with FIG. 6 of the drawing. P1 is the patient- or user-operated adjusting element, and P2 is the adjusting element with which the audiologist sets the basic amplification when the aid is supplied to the user. As mentioned in the earlier example of an 80-year-old presbyacusis patient with a low-frequency hearing loss of 20 dB, the audiologist thus sets P2 at a suitable value in relation to the hearing loss and the patient's other data.

Figure 4:
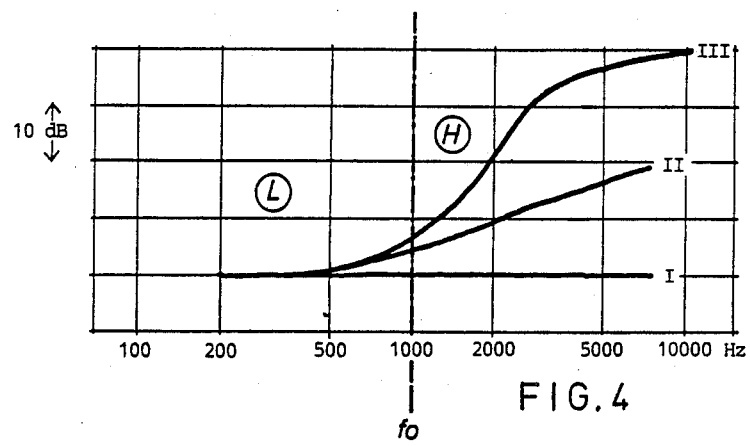
FIG. 4 shows an example of the relative insertion gain with different settings of the patient-operated control.

In FIG. 4 is seen the relative insertion gain which the users themselves can introduce by means of the regulating element P1, from an absolute minimum, i.e. curve I frequency-independent, to curve II with medium insertion and to curve III with maximum high-frequency insertion gain. The curves are naturally only an example. The regulating element P1 is generally designed as a continuous regulation in the form of a adjustable resistor, but can naturally also be in the form of a step-switch.

Figure 5:
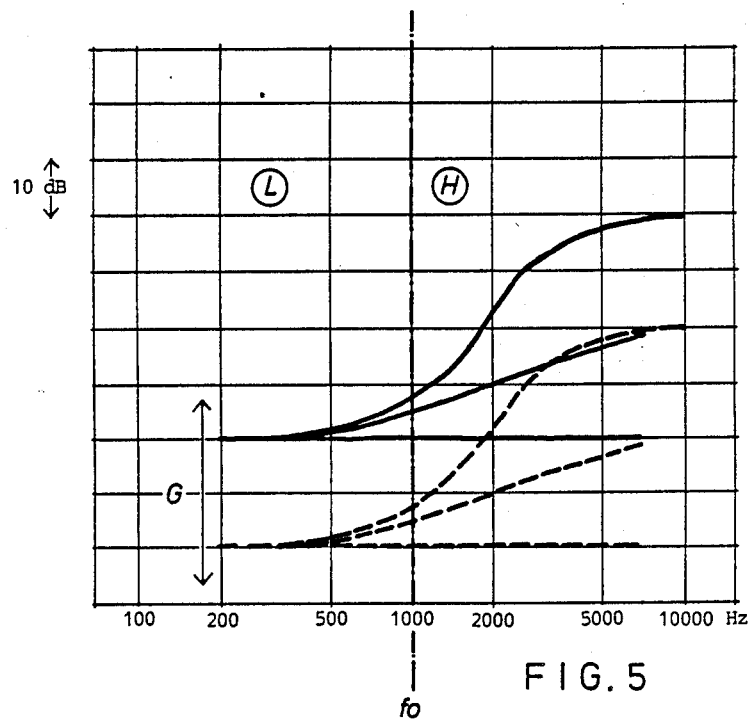
FIG. 5 shows an example of relative insertion gain with combinations of settings of the patient-operated control an basic amplification control.

In FIGS. 4 and 5, the frequency range is divided into two ranges L and H at a frequency of at approximately 1000 Hz, which is a transition frequency for the regulation circuit 3 which is described in more detail in connection with FIG. 6 of the drawing.

The transition frequency of is described as being at approximately 1000 Hz, but it will be obvious to those familiar with the art that of can lie in the range between 500 Hz and 2000 Hz, which also appears form FIGS. 4 and 5. fo at approximately 1000 Hz is thus only an example used in the explanation of the invention.

Returning now to the mentioned example of the 80-year-old patient, in FIG. 5 with the double arrow G is shown how the curve picture in FIG. 4 can be displaced in a parallel manner upwards and downwards by the setting of the basic amplification by means of the regulating element P2. As an example, the curve picture shown with continuous lines is raised 20 dB in relation to the stippled curve picture, so that the total treble boost at approximately. 8000 Hz is now a basic amplification of 20 dB plus a possible maximum increase of the insertion gain of approximately 40 dB, i.e. a total of approximately 60 dB. In this example, the patient can thus regulate upwards until a hearing level corresponding to a total amplification in the treble range of 60 dB is reached. The raising of the basic amplification by 20 dB, corresponding to the hearing loss at frequencies below 1000 Hz, is shown in FIG. 5 only as an example in order to explain the invention. How much the basic amplification shall be raised in relation to the low-frequency hearing loss will depend on many factors, including the patient's audiograms, the type of hearing impairment and the patient's remaining data.

The curves shown in FIGS. 4 and 5 are only examples of tested amplification constructions. It will be obvious to those familiar with the art that many other amplification constructions can be used, and that other frequency responses and treble boosts can be achieved without deviating from the basic idea of the invention.

The curve III for maximum relative insertion gain in FIG. 4 is shown with a flattening-out, i.e. with a maximum relative treble boost at approximately 40 dB. This is naturally only an example, in that the frequency response can be arranged in many ways, all depending on the actual need.

Figure 6:
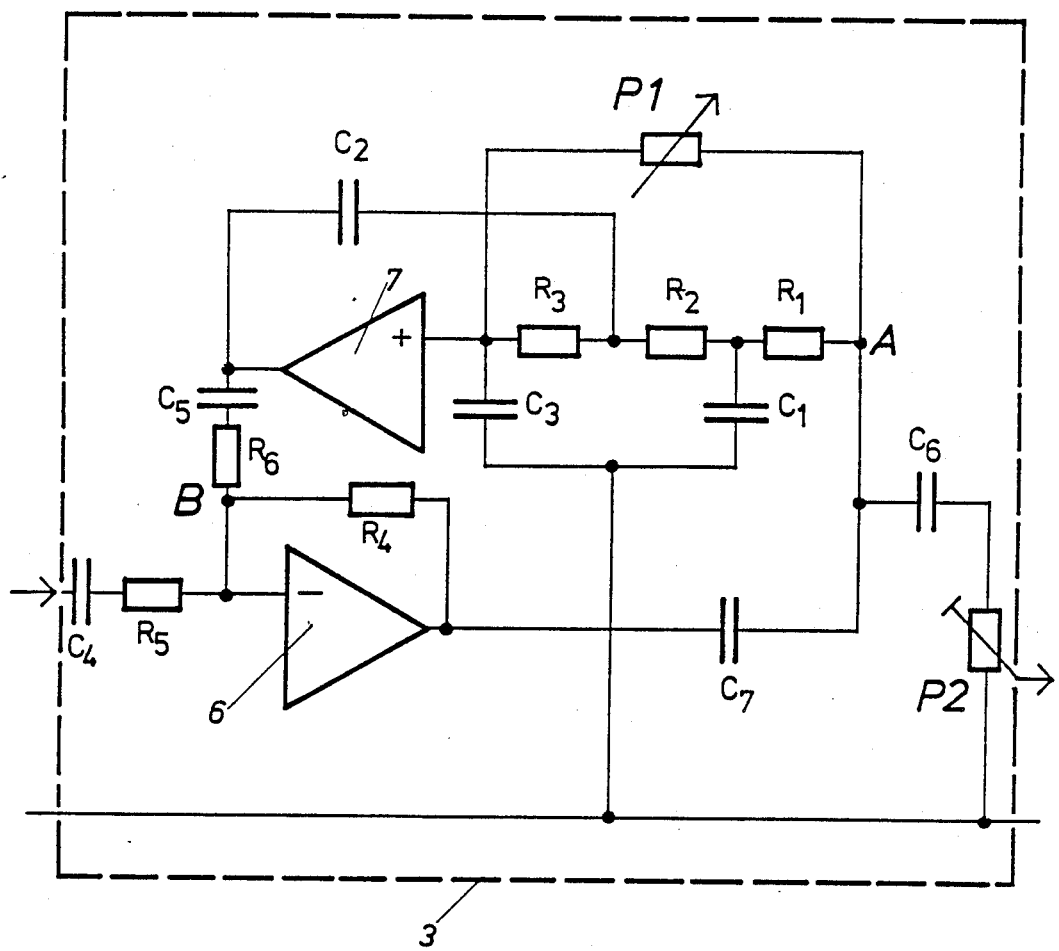
FIG. 6 shows a diagram of the regulation part in one form of embodiment of a hearing aid according to the invention.

FIG. 6 shows an example of how the regulating part 3 may be arranged. The principle is that by means of an adjustable frequency-dependent negative feedback there is obtained an adjustable treble-lift for frequencies higher than the transition frequency fo.

The amplifier 6 is an inverting amplifier with negative feedback via two parallel feedback paths R4 and the circuit between A and B (shown within the inner dashed line frame), respectively.

In case the above circuit between A and B was not connected, the resulting amplification of the amplifier 6 would only be fed back via R4 and thus roughly be the ratio between R4 and R5, i.e.:

Amplification of amplifier 6 without circuitry between A and B is $$\frac{R4}{R5}.$$

The circuit between A and B is an adjustable 3rd order filter consisting of R1, C1, R2, R3, C3, C2, C5, R6, C7 and amplifier 7. The amplifier 7 has a pre-set natural amplification between 1 or higher. In the following text it is assumed to be 1. The transition frequency of the filter is determined by the components R1, R2, R3, C1, C2 and C3. The transition frequency fo of the filter is obtained as:

$$f_0 = \frac{(R_1 \cdot R_2 \cdot R_3 \cdot C_1 \cdot C_2 \cdot C_3)^{\frac{1}{3}}}{2\pi}$$

By means of P1 the efficiency of the filter is determined, i.e. its capability of damping frequencies higher than the transition frequency fo. If P1 is set at a low value, the effect of the filter is inactivated since the effect of the components determining the transition frequency is short-circuited. If on the contrary P1 is at its maximum value, which in practice is many times greater than the sum of R1, R2 and R3, there is obtained maximum filter effect.

The effect of this variable filter connected between A and B in the negative feedback circuit for the amplifier 6 is that by means of P1 there is obtained an adjustable amplification for frequencies higher than the transition frequency fo. The smaller the signal being fed back via the circuit between A and B the greater the amplification of the feedback amplifier 6 and thus the regulating circuit 3. Since the circuit between A and B with P1 at its maximum value will dampen frequencies higher than the transition frequency fo, the opposite effect by connecting the feedback of the amplifier 6 is obtained i.e. increased amplification by frequencies above the transition frequency fo.

By frequencies below the transition frequency fo, there is obtained an amplification of the regulating part corresponding to the parallel value of R4 and R6 divided by R5, i.e.:

Amplification of frequencies below $$fo = \frac{R4//R6}{R5}.$$

Alternatively, this equation may be expressed as follow:

$$fo = \frac{\frac{R4 \cdot R6}{R4 + R6}}{R5}$$

This amplification is also obtained at high frequencies if P1 is set at its lowest value.

With the regulating circuit set at maximum treble-lift, i.e. with P1 set at its highest value, there is obtained an amplification of the regulating part for frequencies much higher than the transition frequency fo determined by the ratio of the resistors R4 and R5 in that the feedback signal of the filter is so much dampened as it can be ignored, i.e.: Amplification of frequencies much higher than $$fo = \frac{R4}{R5}$$

P2 is a frequency-independent amplification control obtained by means of a potentiometer.

If the user only has use for one or two of the aids of the type shown in FIG. 2, the electrical circuit for such an aid is more simple than that shown in FIG. 6, in that the function of P2 can be omitted and the amplifier system simplified and made cheaper.

CLINICAL TRIALS

Clinical tests performed at a Danish hearing center with experienced hearing instrument wearers showed that none of the patients found the Clarity Control more difficult to use than the traditional volume control. In conversations in quiet surroundings, the majority did not indicate any preference between the new and the traditional instrument. However, in conversations in noisy surroundings and when listening to the radio and TV, none of the patients preferred their traditional instrument, and the majority of the patients found the general sound quality better in the new instrument.

In another clinical test performed at another Danish hearing center with five first-time hearing instrument wearers, all the patients spontaneously declared that they preferred the new instrument to a traditional instrument. The trial period lasted for two months where the wearers had both instruments at their disposal.

Generally, in all the tests, the patients stated that the sound was more tranquil and that speech was more distinct with their new instrument, particularly against background noise. Most of the patients also stated that by using the Clarity Control they could focus on the correct balance between the tolerance level and their immediate auditory need. As a part of the clinical tests, it also was desired to see whether and to what degree the wearers could adjust to hearing and discriminating high frequencies. This was done simply by reading the setting of the Clarity Control during the test periods. Most wearers had a higher setting by the end of the period than in the beginning, indicating that adjustment had taken place. However, the change of setting differed greatly between individuals, indicating a widespread pace in which adjustment takes place.

This new concept of hearing instrument offers an alternative to traditional hearing instruments for high frequency hearing loss and may be particularly useful for candidates who would normally reject the use of amplification or not be considered hearing instrument candidates at all.

We claim:

1. A hearing aid comprising:
   a sound inlet with sound detector;
   an adjustable electronic analog amplification circuit including a pre-amplifier and an output amplifier;
   a sound reproducer;
   a regulation part including first regulation means for adjusting the frequency response of the amplification circuit, the regulation part arranged for finger operation at any time thereby allowing the user to directly gradually adjust the amplifier's frequency response slope for frequencies above a transition frequency and for frequencies in an amplitude range above a frequency independent amplitude setting so that the variable treble boost is obtained according to the user's individual needs and acceptance;
   where said transition frequency is between 500 Hz–2 Khz;
   wherein said regulation part includes second regulation means arranged to regulate the basic amplification of the amplifier circuit in a substantially frequency independent manner and
   wherein said regulation part further includes a third-order filter, the third-order filter comprising a resistor-capacitor network and an amplification circuit with a feedback path which contains an additional amplifier, wherein the third-order filter determines the frequency response and thus determines the degree of variable treble boost.

2. A hearing aid according to claim 1 wherein regulation of the amplification in the feedback path of each of the regulation elements is accomplished by a single user-operated regulation part.

* * * * *

UNITED STATES PATENT AND TRADEMARK OFFICE
CERTIFICATE OF CORRECTION

PATENT NO. : 4,941,179

DATED : 10 July 1990

INVENTOR(S) : Bergenstoff et al.

It is certified that error appears in the above-identified patent and that said Letters Patent is hereby corrected as shown below:

Column 3, line 68, please delete "as" and insert --according to the present invention--.

Column 4, line 27, please delete "an" and insert --and--.

Column 5, line 43, please delete "of" and insert --fo--.

Column 5, line 45, please delete "of" and insert --fo--.

Signed and Sealed this

Fourteenth Day of July, 1992

Attest:

DOUGLAS B. COMER

*Attesting Officer*       Acting Commissioner of Patents and Trademarks